United States Patent
Adkins et al.

(10) Patent No.: US 9,559,689 B2
(45) Date of Patent: Jan. 31, 2017

(54) VEHICLE CONTROL SWITCH WITH CAPACITIVE TOUCH REDUNDANCY ACTUATION

(71) Applicant: Eaton Corporation, Cleveland, OH (US)

(72) Inventors: Kyle Benjamin Adkins, Oak Creek, WI (US); Dana Kathryn Leland, Milwaukee, WI (US)

(73) Assignee: Eaton Corporation, Cleveland, OH (US)

( * ) Notice: Subject to any disclaimer, the term of this patent is extended or adjusted under 35 U.S.C. 154(b) by 496 days.

(21) Appl. No.: 14/160,896

(22) Filed: Jan. 22, 2014

(65) Prior Publication Data

US 2015/0203056 A1    Jul. 23, 2015

Related U.S. Application Data

(60) Provisional application No. 61/804,927, filed on Mar. 25, 2013.

(51) Int. Cl.
*B60L 1/00*     (2006.01)
*H01H 23/16*    (2006.01)
(Continued)

(52) U.S. Cl.
CPC .......... *H03K 17/962* (2013.01); *H01H 23/025* (2013.01); *H01H 23/16* (2013.01);
(Continued)

(58) Field of Classification Search
CPC ................ H03K 17/962; H03K 2217/960755; H01H 23/025; H01H 23/16; H01H 2239/006; Y10T 29/49105
(Continued)

(56) References Cited

U.S. PATENT DOCUMENTS 5,410,148 A      4/1995   Barron, Jr. et al.
7,466,040 B2 *  12/2008   Bruwer ............. H05B 37/0227
                                                    307/116

(Continued)

FOREIGN PATENT DOCUMENTS

CN         101065904 A      10/2007

*Primary Examiner* — Hal Kaplan
(74) *Attorney, Agent, or Firm* — Ziolkowski Patent Solutions Group, SC (57) ABSTRACT

A vehicle control switch for controlling operation of a device in a motor vehicle is disclosed. The vehicle control switch includes an electromechanical switch switchable between ON and OFF states responsive to physical actuation of the electromechanical switch by an operator, the physical actuation comprising an application of force onto the electromechanical switch by the operator. The vehicle control switch also includes a capacitance sensitive touch sensor positioned adjacent the electromechanical switch and whose capacitance changes when brought into contact with a grounded object, with activation of the electromechanical switch into the ON state being inhibited until a grounded object is brought into contact with the capacitance sensitive touch sensor, such that an activation of the rocker switch to the ON state is enabled only upon contact with the capacitance sensitive touch sensor by the grounded object.

18 Claims, 4 Drawing Sheets

(51) Int. Cl.
*H03K 17/96* (2006.01)
*H01H 23/02* (2006.01)

(52) U.S. Cl.
CPC ............... *H01H 2239/006* (2013.01); *H03K 2217/960755* (2013.01); *Y10T 29/49105* (2015.01)

(58) Field of Classification Search
USPC .................................................. 307/10.1, 9.1
See application file for complete search history.

(56) References Cited

U.S. PATENT DOCUMENTS

| | | |
|---|---|---|
| 7,783,009 B2 | 8/2010 | Bielski et al. |
| 8,058,993 B2 | 11/2011 | Hammerschmidt et al. |
| 8,324,910 B2 | 12/2012 | Lamborghini et al. |
| 8,658,929 B2 * | 2/2014 | Hoffknecht .......... H03K 17/962 200/600 |
| 2010/0079153 A1 | 4/2010 | Maloof et al. |

* cited by examiner

VEHICLE CONTROL SWITCH WITH CAPACITIVE TOUCH REDUNDANCY ACTUATION

CROSS-REFERENCE TO RELATED APPLICATION

The present application is a non-provisional of and claims priority to U.S. Provisional Application Ser. No. 61/804,927 filed Mar. 25, 2013, the disclosure of which is incorporated herein.

BACKGROUND OF THE INVENTION

The present invention relates generally to vehicle control switches for use in motor vehicles and, more particularly, to a system and method for providing a vehicle switch having a capacitive touch redundancy feature that enables actuation of the switch. The capacitive touch redundancy feature is employed on critical and safety related vehicle control switches such that actuation of the switches is controlled with the capacitive touch redundancy feature, thereby preventing accidental actuation of the switches.

In specialty vehicle markets—such as heavy trucks, agricultural equipment, and construction equipment, for example—electrical switches are used as control switches for a variety of applications, including general vehicle features/applications (e.g., switching the motor vehicle lighting, the windshield wipers, the rear windshield heating, the cruise control functions, etc., on and off) and critical or safety related vehicle features/applications (e.g., power take-off (PTO) switches, "e-stop" type switches, etc.). The critical and safety related control switches in such vehicles often include some sort of redundancy feature it which two separate actions are required by an operator to actuate the switch, so as to prevent accidental actuation of the switch.

For purposes of illustration of how such a redundancy feature is typically implemented, a PTO switch that is found on heavy trucks, agricultural equipment, and construction equipment is discussed here below. Standard PTO switches are configured to have a redundancy requirement for actuation, with PTO switches typically being designed to address the dual actuation/redundancy requirement by mechanical means. For example, existing PTO switches often require an operator to pull the PTO switch lever up before moving it up, to lift a cover before actuation of the switch, or to slide a locking mechanism before pressing the switch. While such dual mechanical actuations are adequate and effective for purposes of preventing accidental actuation of the PTO switch, the motions required for performing the dual mechanical actuations are often awkward and/or uncomfortable for an operator, as they are not ergonomic movements.

It would therefore be desirable to design a control switch for critical or safety related vehicle features/applications (e.g., PTO switch) that includes a redundancy feature having superior ergonomics as compared to existing switches that require dual actuation by mechanical means. It would further be desirable for such a control switch to provide superior ergonomics and ease of dual actuation without comprising the safety features of the switch, by still providing complete protection against accidental actuation of the switch.

BRIEF DESCRIPTION OF THE INVENTION

Embodiments of the present invention provide a vehicle control switch that includes a capacitive touch redundancy feature that selectively enables actuation of the switch. The capacitive touch redundancy feature can be employed on critical and safety related vehicle control switches such that actuation of the switches is performed in a controlled fashion that prevents accidental actuation of the switch.

In accordance with one aspect of the invention, a vehicle control switch for controlling operation of a device in a motor vehicle includes an electromechanical switch switchable between ON and OFF states responsive to physical actuation of the electromechanical switch by an operator, the physical actuation comprising an application of force onto the electromechanical switch by the operator. The vehicle control switch also includes a capacitance sensitive touch sensor positioned adjacent the electromechanical switch and whose capacitance changes when brought into contact with a grounded object, with activation of the electromechanical switch into the ON state being inhibited until a grounded object is brought into contact with the capacitance sensitive touch sensor, such that an activation of the rocker switch to the ON state is enabled only upon contact with the capacitance sensitive touch sensor by the grounded object.

In accordance with another aspect of the invention, a vehicle control switch includes an electromechanical switch switchable between ON and OFF states responsive to physical actuation of the electromechanical switch by an operator, the physical actuation comprising an application of force onto the electromechanical switch by the operator. The vehicle control switch also includes a capacitive touch switch positioned adjacent the electromechanical switch whose capacitance changes when brought into contact with a finger of the operator and a switch controller operatively connected to the electromechanical switch and the capacitive touch switch. The switch controller is programmed to sense when a finger of the operator is brought into contact with the capacitive touch switch, measure a duration of time which the finger of the operator is in contact with capacitive touch switch, compare the duration of time to a time threshold and, if the duration of time exceeds the time threshold, then enable activation of the electromechanical switch into the ON state.

In accordance with yet another aspect of the invention, a method of manufacturing a vehicle control switch includes providing a rocker switch that is switchable by an operator between an ON state and an OFF state, positioning a bezel adjacent a bottom of the rocker switch, providing a capacitance sensitive touch sensor on an underside of the bezel whose capacitance changes when brought into contact with a finger of an operator, and operatively connecting a switch controller to the rocker switch and the capacitance sensitive touch sensor, the controller being programmed to sense when a finger of the operator is brought into contact with the capacitance sensitive touch sensor, measure a duration of time which the finger of the operator is in contact with the capacitance sensitive touch sensor, compare the duration of time to a time threshold and, if the duration of time exceeds the time threshold, then enable actuation of the rocker switch into the ON state responsive to a physical actuation of the rocker switch by the operator.

Various other features and advantages of the present invention will be made apparent from the following detailed description and the drawings.

BRIEF DESCRIPTION OF THE DRAWINGS

The drawings illustrate preferred embodiments presently contemplated for carrying out the invention.

In the drawings.

DETAILED DESCRIPTION OF THE INVENTION

Embodiments of the invention are directed to vehicle control switches having a capacitive touch redundancy feature that selectively enables actuation of the switch. The capacitive touch redundancy feature can be employed on critical and safety related vehicle control switches such that actuation of the switches is performed in a controlled fashion that prevents accidental actuation of the switch.

Figure 1:
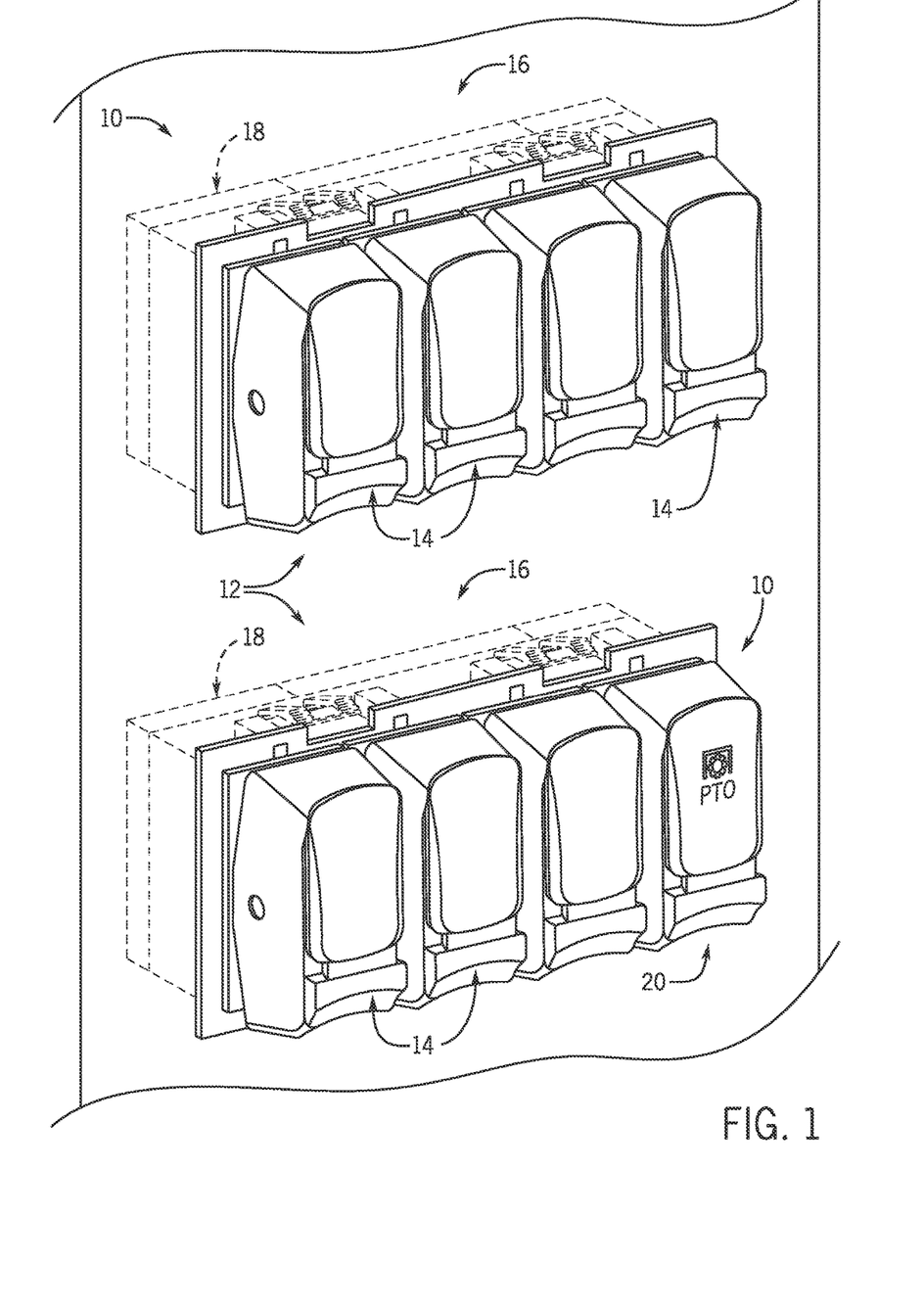
FIG. 1 shows a partial view of a vehicle dashboard including an arrangement of vehicle control switches, according to an embodiment of the invention.

Referring to FIG. 1, the general layout of a portion of a vehicle dashboard 10 having an arrangement 12 of vehicle control switches 14 is shown according to an embodiment of the invention. The switch arrangement 12 is incorporated as part of the dashboard 10 in a motor vehicle, such as a heavy truck, goods vehicle, agricultural equipment, or construction equipment, for example. An operator of the vehicle uses the vehicle control switches 14 to operate various functions in the vehicle, such as for switching the motor vehicle lighting, the windshield wipers, the diesel fuel heating, or controlling other specialized equipment on the vehicle—such as a power take-off (PTO) or "safety" related vehicle feature. In the embodiment illustrated in FIG. 1, the switch arrangement 12 is divided into a number of switch modules 16—with each switch module 16 including a number of switches 14 therein. It is recognized that a greater or smaller number of switch modules 16, and switches 14 per module, could be included in the switch arrangement 12, and that the arrangement of switches 14 in each module 16 could differ, such as the switches being arranged in a single row or in two rows, for example. Thus, the switch arrangement 12 illustrated in FIG. 1 is meant to be an example only and is not meant to limit the scope of the invention in any regard.

As further shown in FIG. 1, each switch module 16 is received within a module housing 18 that is fitted in the dashboard 10 of the motor vehicle. The housing 18 is formed as a generally hollow member configured to receive the individual switches 14 therein and includes mating features formed thereon (not shown) that enable mating of the switches 14 within the housing 18 in the correct orientation. The switch module 16 includes communication ports and a power receptacle (not shown) formed on a back surface thereof to enable powering of the module and communication to/from the module, such as via mating of the modules 16 with a vehicle communication interface feature that enables the switch modules to communicate with a communication bus of the vehicle, such as a CAN or LIN bus, for example.

According to embodiments of the invention, one or more of the vehicle control switches 14 included in switch arrangement 12 is constructed as a switch that requires two separate actions by an operator to actuate the switch (i.e., a redundancy feature), so as to prevent accidental actuation of the switch. In FIG. 1, a single vehicle control switch 20 is shown as such a redundant activation vehicle control switch, but it is recognized that a greater number of switches in the arrangement 12 could be constructed as redundant activation vehicle control switches. In one embodiment, the redundant activation vehicle control switch 20 controls operation of a PTO, although it is recognized that the control switch 20 could instead control another vehicle operation, such as other critical and safety related features (e.g., an "e-stop" switch).

Figure 2:
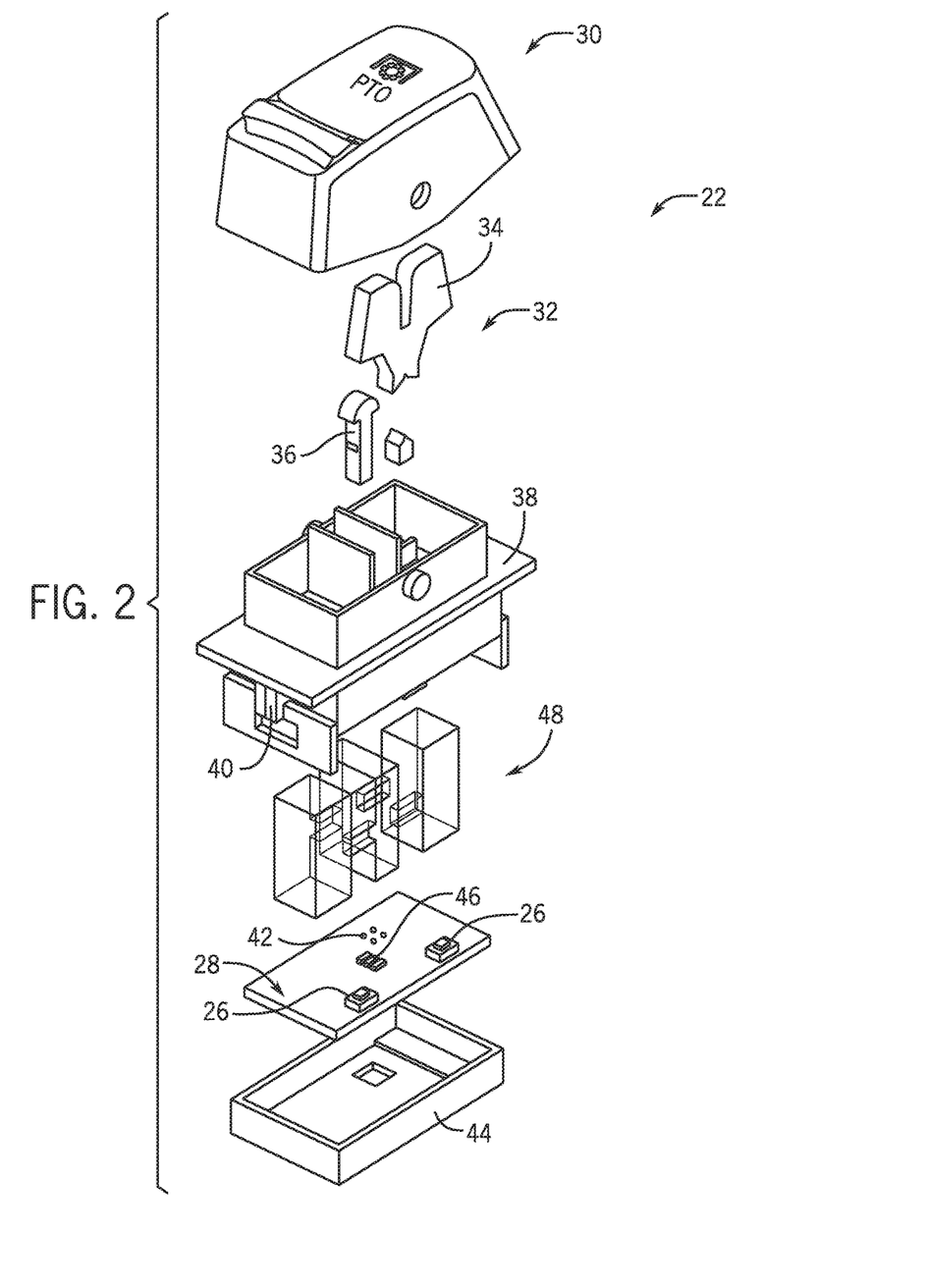
FIG. 2 is a perspective view of a redundant activation vehicle control switch that can be incorporated in the vehicle dashboard of FIG. 1, according to an embodiment of the invention
Figure 3:
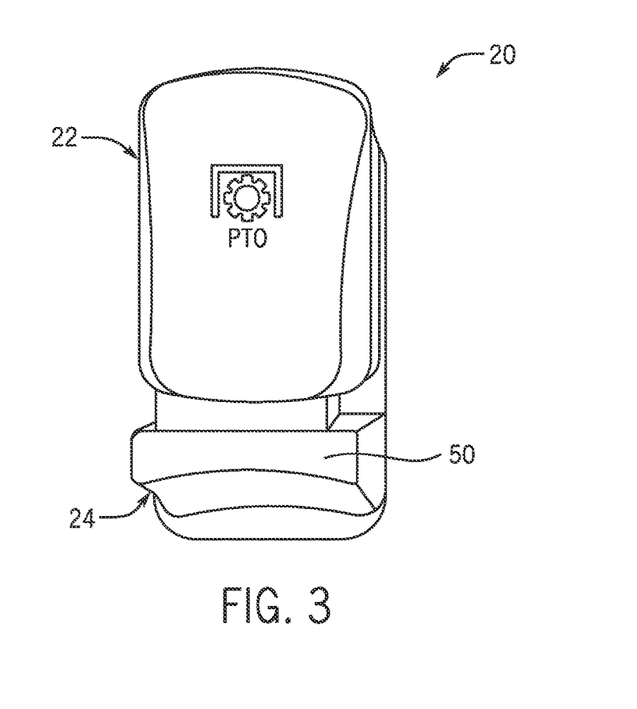
FIG. 3 is a schematic block diagram of the redundant activation vehicle control switch of FIG. 2.

More detailed views of the redundant activation vehicle control switch 20 are illustrated in the perspective and block schematic views of the switch provided in FIGS. 2 and 3 in, according to an exemplary embodiment of the invention. In general, the vehicle control switch 20 includes an electromechanical switch 22—here shown as a rocker switch—that is switchable between ON and OFF states responsive to physical actuation of the electromechanical switch by an operator (e.g., lifting or pressing motion/force by the operator), and a capacitive touch switch 24 (i.e., capacitance sensitive touch sensor) positioned adjacent the electromechanical switch 22 whose capacitance changes when brought into contact with a grounded object, such as the finger of an operator. The structure of an exemplary electromechanical switch is described in further detail below, and the capacitance sensitive touch sensor 24 may be of a known construction having an outer guard layer that covers a capacitance sensitive touch plate whose capacitance is changed when contacted by a grounded object (e.g., a finger) so as to lead to a change in voltage produced by the sensor 24, with change in voltage being reflected in a signal that is output from the capacitance sensitive touch sensor 24.

Referring now to FIG. 2, an exploded view of an individual rocker switch 22 that forms part of the redundant activation vehicle control switch 20 is shown in more detail, according to an exemplary embodiment. The rocker switch 22 contains an operable contact 26 (in the form of tactile switches) affixed to a printed circuit board (PCB) 28. Other contact types, such as metal domes or carbon pills may be employed, but is not limited to those types. A rocker button 30 is used to activate the switch contact 26 by means of an actuator system 32. The actuator system 32 is shown in this embodiment to be comprised of a rocking actuator 34 and a pushrod 36 to convert the rotational movement of the rocker 30 to a vertical displacement. The pushrod 36 acts upon the contact 26 to provide the switching signal. A switch frame 38 serves to enclose the actuator system 32 and to affix the rocker button 30 to the switch 22. The frame 38 also provides keying and retention features 40 formed thereon and arranged to ensure the correct orientation and retention of the switch 22 within the module housing 18 (FIG. 1) and to ensure proper alignment and mating of electrical connections.

In operation of rocker switch 22, the rocker button 30 is used in order to provide manual switching for the contact 26 and actuator system 32. When the rocker 30 is in the OFF position, then the contact 26 and the actuator system 32 are in the switched-off state. If the user lifts/pulls an upper edge of the rocker 30, the rocker 30 is moved to an operated switch position and, in consequence, the contact 26 and the actuator system 32 is moved to a switched ON state. The contact 26, when in a switched-on state, communicates a desired activation of device(s) associated with the switch 22 via electrical connections formed on the PCB 28 of the switch 22. That is, signals from the switch 22 can be communicated out to the switch module 16 (FIG. 1) via a electrical/communications connection 42, such as a pin-connector formed on the PCB 28 that extends through an opening formed in a rear plate 44 of the switch 22.

In addition, the rocker switch 22 contains light emitting diodes (LEDs) 46 forming an LED indicator that is located on the PCB 28 to provide illumination of a graphic icon on the rocker button 30 to identify the switch function and additionally to provide a visual indication of the switch state to the user. The light from the LEDs 46 is conducted through the frame 38 to the rocker 30 by means of one or more light pipes 48.

Referring back again now to FIGS. 2 and 3, the redundant activation vehicle control switch 20 also includes a bezel 50 that is positioned beneath the rocker switch 22. The bezel 50 houses the capacitance sensitive touch sensor 24 therein and provides access to the sensor at an underside of the bezel. By integrating the capacitance sensitive touch sensor 24 into the bezel 50, the sensor 24 is positioned adjacent the rocker switch 22 so as to be in an ergonomically desirable arrangement therewith that enables redundant activation of the rocker switch 22 and the capacitance sensitive touch sensor 24 via a thumb and index finger of the operator, respectively. That is, in switching ON the vehicle control switch 20, the operator places their thumb underneath the bezel 50 and on the capacitance sensitive touch sensor 24 and holds their thumb in this position for a set period of time to "activate" the capacitance sensitive touch sensor 24, at which point the rocker switch 22 can be lifted with the index finger to actuate the rocker switch 22 into an ON state, such that the redundant vehicle control switch 20 is ON.

As shown in FIG. 3, a switch controller or processor 52 is also included in the redundant activation vehicle control switch 20 that is in operative communication with both the rocker switch 22 and the capacitance sensitive touch sensor 24. The switch controller 52 is programmed to selectively inhibit and enable activation of the rocker switch 22 based on a sensed placement of an operator finger on the capacitance sensitive touch sensor 24. When a finger of an operator is in contact with the capacitance sensitive touch sensor 24, the switch controller 52 receives an input signal from the capacitance sensitive touch sensor 24 regarding a change in capacitance of the capacitance sensitive touch sensor. The switch controller 52 is programmed to measure a duration of this input signal and compare it to a pre-determined time threshold that is indicative of an affirmative placement of the operator finger on the capacitance sensitive touch sensor 24 (e.g., 2-3 seconds) versus an accidental touching/brushing of the capacitance sensitive touch sensor. If the switch controller 52 determines that the finger of the operator has been in contact with the capacitance sensitive touch sensor 24 for equal to or longer than the threshold time period (based on the duration of the input signal), the switch controller 52 enables activation of the rocker switch 22 into the ON state. Conversely, if the switch controller 52 determines that the finger of the operator has not yet been in contact with the capacitance sensitive touch sensor 24 for equal to or longer than the threshold time period (based on the duration of the input signal), the switch controller 52 inhibits activation of the rocker switch 22 into the ON state.

According to an exemplary embodiment of the invention, in controlling activation of the rocker switch 22 based on a capacitive touch redundancy with capacitance sensitive touch sensor 24, switch controller 52 functions to control/inhibit an output of rocker switch 22 (i.e., signal output regarding ON/OFF state) rather than controlling/inhibiting a physical actuation of the rocker switch. That is, while an operator is able to actuate/lift the rocker switch 22 regardless of whether or not a finger of the operator has been positioned on the capacitance sensitive touch sensor 24 for equal to or longer than the threshold period of time, the rocker switch 22 cannot be activated into the ON state (i.e., output a signal indicating the switch is ON) unless a finger of the operator has been positioned on the capacitance sensitive touch sensor 24 for equal to or longer than the threshold period of time. If the operator lifts the rocker switch 22 to the ON position without a finger of the operator having been positioned on the capacitance sensitive touch sensor 24 for equal to or longer than the threshold period of time, the switch controller 52 functions to maintain the rocker switch 22 in the OFF state even though the switch is physically in the ON position. In order to activate the rocker switch 22 to the ON state at this point, the rocker switch would need to be moved back to the OFF position before redundancy requirements of the capacitance sensitive touch sensor 24 and rocker switch 22 can be met again.

According to an exemplary embodiment of the invention, the switch controller 52 is further programmed to control a visual presentation of the vehicle control switch 20 to indicate a current operational state thereof. That is, as described above with respect to FIG. 4, rocker switch 22 includes an LED indicator 46 therein that illuminates a graphic icon on the rocker switch 22 (i.e., the rocker button 30, FIG. 4) to provide a visual indication to the operator of the switch state, and switch controller 52 functions to control the operation of the LED indicator 46 based on received inputs. In an exemplary embodiment, the switch controller 52 causes the LED indicator 46 to illuminate in one of three distinct colors based on input signals received by the capacitance sensitive touch sensor 24 and the rocker switch 22. In a first operational state, where the rocker switch 22 is in the OFF state and the switch controller 52 has determined that the finger of the operator is not in contact with the capacitance sensitive touch sensor 24 (or has not been in contact with the capacitance sensitive touch sensor 24 for longer than the threshold time period), the switch controller 52 causes the LED indicator 46 to be illuminated in a first color (e.g., white). In a second operational state, where the rocker switch 22 is in the OFF state and the switch controller 52 has determined that the finger of the operator has been in contact with the capacitance sensitive touch sensor 24 for equal to or longer than the threshold time period, the switch controller 52 causes the LED indicator 46 to be illuminated in a second color (e.g., amber). This illumination of the LED indicator 46 in the second color is indicative of a "ready" condition where a lifting actuation of the rocker switch 22 by the operator would cause the rocker switch 22 to activate to the ON state. In a third operational state, where the rocker switch 22 is in the ON state subsequent to a lifting thereof by the operator, the switch controller 52 causes the LED indicator 46 to be illuminated in a third color (e.g., green). This selective illumination of the LED indicator 46 enables an operator to quickly and easily ascertain the current operational state of the vehicle control switch 20.

It is noted that with respect to the illumination of LED indicator 46, the selective illumination of the LED indicator 46 in one of the three colors is the only accurate way to determine the present operating condition of the vehicle control switch 20. That is, it is recognized that the positioning of rocker switch 22 may not accurately reflect the state of the vehicle control switch 20, as in some instances the rocker switch 22 may be actuated/lifted without redundancy requirements with the capacitance sensitive touch sensor 24 having been met (i.e., a finger of the operator may not have been positioned on the capacitance sensitive touch sensor 24 for equal to or longer than the threshold period of time). In such instances, the rocker switch 22 may physically be in an ON position, but the rocker switch 22 will not be in the ON state based on the failure of the operator to meet the redundancy requirements of the switch. When the rocker switch 22 is in the ON position but is still in the OFF state, the LED indicator 46 will remain illuminated in the first color (i.e., white), indicating that the rocker switch 22 is still in the OFF state. Thus, illumination of the LED indicator 46 in the third color (i.e., green) is the only way to truly know that the rocker switch 22 is in the ON state.

Figure 4:
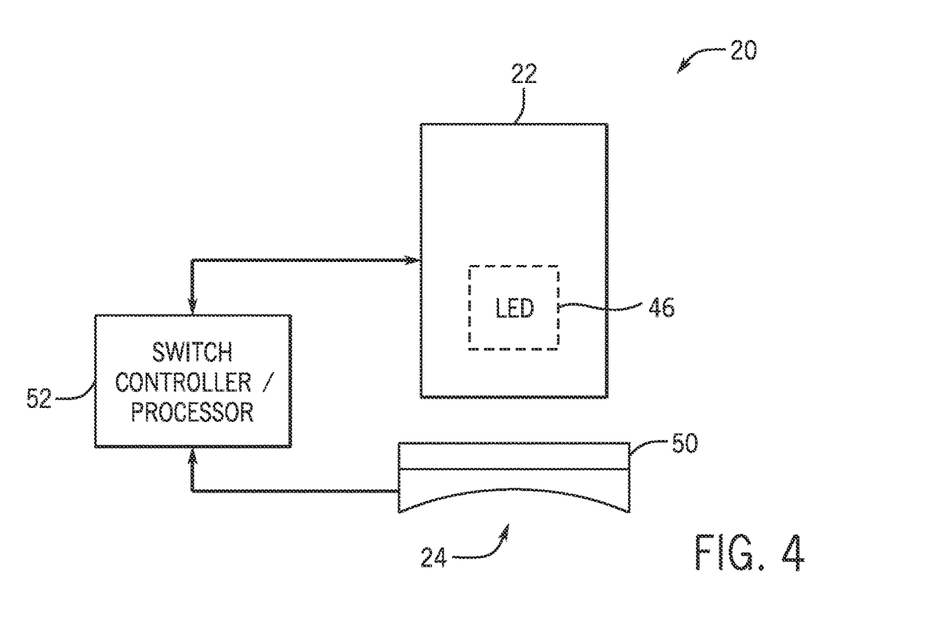
FIG. 4 is an exploded view of a rocker switch included in the redundant activation vehicle control switch of FIGS. 2 and 3, according to an embodiment of the invention.
Figure 5:
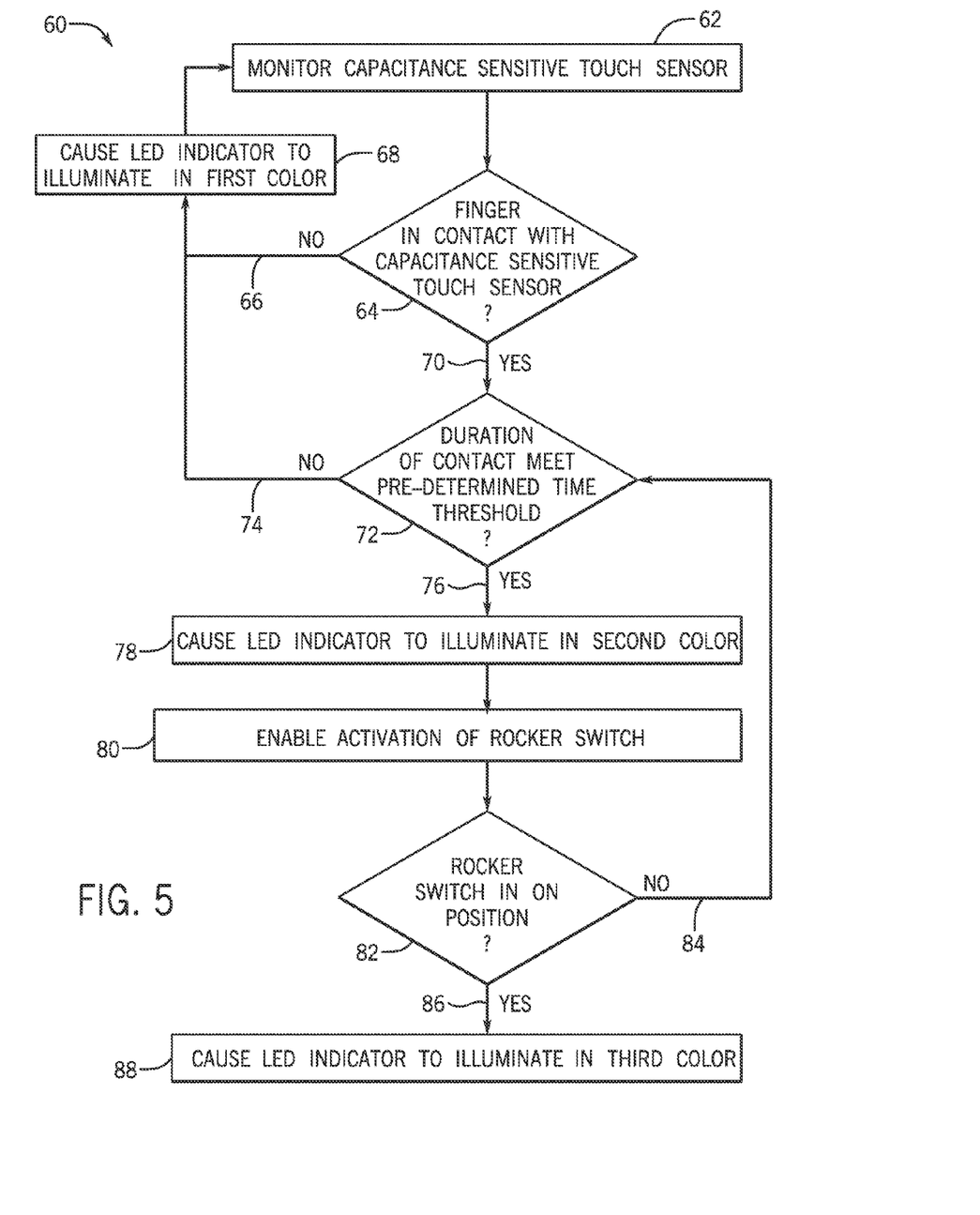
FIG. 5 is a flowchart illustrating a technique for controlling actuation and display characteristics of the vehicle control switch of FIGS. 2 and 3, according to an embodiment of the invention.

Referring now to FIG. 5, and with continued reference back to FIGS. 2-4, a technique 60 performed by the switch controller 52 for controlling actuation and display characteristics of the vehicle control switch 20 is illustrated according to an embodiment of the invention. The technique 60 begins at STEP 62 with a monitoring of the capacitance sensitive touch sensor 24 being performed to identify when a finger of an operator is brought into contact with the sensor. At STEP 64, a determination is made as to whether a finger of an operator is in contact with the capacitance sensitive touch sensor 24—with such a determination made based on monitoring a capacitance (and associated voltage) of the sensor 24 via the switch controller 52. If it is determined at STEP 64 that no finger is in contact with the capacitance sensitive touch sensor 24, as indicated at 66, then the technique continues to STEP 68 where the switch controller 52 causes the LED indicator 46 to be illuminated in a first color (e.g., white), before looping back to STEP 62 to continue monitoring the capacitance sensitive touch sensor 24.

If it is determined at STEP 64 that a finger is in contact with the capacitance sensitive touch sensor 24, as indicated at 70, then the technique continues to STEP 72 where an additional determination is made as to whether the finger of the operator has been in contact with the capacitance sensitive touch sensor 24 for equal to or longer than a threshold time period that is indicative of an affirmative placement of the finger on the capacitance sensitive touch sensor 24 versus an accidental touching/brushing of the capacitance sensitive touch sensor. If it is determined at STEP 72 that the finger of the operator has not been in contact with the capacitance sensitive touch sensor 24 for equal to or longer than the threshold time period, as indicated at 74, the technique loops back to STEP 68 with the switch controller 52 causing the LED indicator 46 to be illuminated in the first color (e.g., white), before looping back to STEP 62 to continue monitoring the capacitance sensitive touch sensor 24.

If it is determined at STEP 72 that the finger of the operator has been in contact with the capacitance sensitive touch sensor 24 for equal to or longer than the threshold time period, as indicated at 76, the technique continues to STEP 78 where the switch controller 52 causes the LED indicator 46 to be illuminated in a second color (e.g., amber) that is indicative of a "ready" condition where a lifting actuation of the rocker switch 22 by the operator would result in activation of the rocker switch into the ON state. Next, at STEP 80, the switch controller 52 enables activation of the rocker switch 22 such that a lifting actuation of the rocker switch 22 by the operator would result in activation of the rocker switch into the ON state. In one embodiment, this activation enabling is achieved via logic in the switch controller 52, with the logic providing for outputting of a signal from the switch controller 52 indicating the vehicle control switch is in the ON state when the rocker switch 22 is actuated.

As shown in FIG. 5, technique 60 continues at STEP 82 with a determination being made as to whether the rocker switch 22 has been actuated (i.e., lifted) by the operator into the ON position. If it is determined at STEP 82 that the rocker switch 22 is not in the ON position, as indicated at 84, the technique loops back to STEP 72 to again determine whether the finger of the operator has been in contact with the capacitance sensitive touch sensor 24 for equal to or longer than a threshold time period (i.e., if the finger of the operator is still on the capacitance sensitive touch sensor 24). Conversely, if it is determined at STEP 82 that the rocker switch 22 has been moved to the ON position, as indicated at 86, the technique 60 continues at STEP 88 with the switch controller 52 causing the LED indicator 46 to be illuminated in a third color (e.g., green) that indicates the rocker switch 22 is in the ON position.

While an embodiment of the redundant activation vehicle control switch 20 has been shown and described as including an electromechanical switch in the form of a rocker switch 22, it is recognized that in additional embodiments of the invention the electromechanical switch could have a different construction. That is, embodiments of the redundant activation vehicle control switch are envisioned that include an electromechanical switch of a different construction, such as a lever style switch or push button switch, for example, and thus the invention should not be limited only to the exemplary embodiment shown in FIGS. 1-4 that implements a rocker switch. Still further, it is recognized that other suitable switches—such as a switch incorporating a Hall Effect device/magnet combination—could be substituted for the electromechanical switch and used in combination with the capacitance sensitive touch sensor to form a redundant activation vehicle control switch 20.

Beneficially, embodiments of the invention thus provide a vehicle control switch having a capacitive touch redundancy feature that selectively enables actuation of the switch. The capacitive touch redundancy feature can be employed on critical and safety related vehicle control switches such that actuation of the switches is performed in a controlled fashion that prevents accidental actuation of the switch. The capacitive touch redundancy feature is employed for actuating the vehicle control switch to an ON position, while enabling an operator to actuate the switch to an OFF position with the redundancy requirement (i.e., by simply pushing the rocker switch). The vehicle control switch is further constructed to provide superior ergonomics and a long switch lifetime, while also providing both lighting and mechanical indicators to an operator regarding a state/position of the switch.

As an additional benefit, in an embodiment in which a rocker switch is utilized in the redundant activation vehicle control switch, the vehicle control switch can be made to look similar (or identical) to other vehicle control switches on the vehicle dashboard so as to maintain a level of design uniformity with other rocker switches on the vehicle dashboard—as compared to existing redundant activation switches that may employ a large lever that is stylistically different from other dashboard controls. However, the rocker switch of the redundant activation vehicle control switch may be a different color than other control switches (e.g., red or yellow) to enable an operator to quickly and easily distinguish the redundant activation control switch from other control switches.

Therefore, according to one embodiment of the present invention, a vehicle control switch for controlling operation of a device in a motor vehicle includes an electromechanical switch switchable between ON and OFF states responsive to physical actuation of the electromechanical switch by an operator, the physical actuation comprising an application of force onto the electromechanical switch by the operator. The vehicle control switch also includes a capacitance sensitive touch sensor positioned adjacent the electromechanical switch and whose capacitance changes when brought into contact with a grounded object, with activation of the electromechanical switch into the ON state being inhibited until a grounded object is brought into contact with the capacitance sensitive touch sensor, such that an activation of the rocker switch to the ON state is enabled only upon contact with the capacitance sensitive touch sensor by the grounded object.

According to another embodiment of the present invention, a vehicle control switch includes an electromechanical switch switchable between ON and OFF states responsive to physical actuation of the electromechanical switch by an operator, the physical actuation comprising an application of force onto the electromechanical switch by the operator. The vehicle control switch also includes a capacitive touch switch positioned adjacent the electromechanical switch whose capacitance changes when brought into contact with a finger of the operator and a switch controller operatively connected to the electromechanical switch and the capacitive touch switch. The switch controller is programmed to sense when a finger of the operator is brought into contact with the capacitive touch switch, measure a duration of time which the finger of the operator is in contact with capacitive touch switch, compare the duration of time to a time threshold and, if the duration of time exceeds the time threshold, then enable activation of the electromechanical switch into the ON state.

According to yet another embodiment of the present invention, a method of manufacturing a vehicle control switch includes providing a rocker switch that is switchable by an operator between an ON state and an OFF state, positioning a bezel adjacent a bottom of the rocker switch, providing a capacitance sensitive touch sensor on an underside of the bezel whose capacitance changes when brought into contact with a finger of an operator, and operatively connecting a switch controller to the rocker switch and the capacitance sensitive touch sensor, the controller being programmed to sense when a finger of the operator is brought into contact with the capacitance sensitive touch sensor, measure a duration of time which the finger of the operator is in contact with the capacitance sensitive touch sensor, compare the duration of time to a time threshold and, if the duration of time exceeds the time threshold, then enable actuation of the rocker switch into the ON state responsive to a physical actuation of the rocker switch by the operator.

The present invention has been described in terms of the preferred embodiment, and it is recognized that equivalents, alternatives, and modifications, aside from those expressly stated, are possible and within the scope of the appending claims.

What is claimed is:

1. A vehicle control switch for controlling operation of a device in a motor vehicle, the vehicle control switch comprising:

an electromechanical switch switchable between ON and OFF states responsive to physical actuation of the electromechanical switch by an operator, the physical actuation comprising an application of force onto the electromechanical switch by the operator; and a capacitance sensitive touch sensor positioned adjacent the electromechanical switch and whose capacitance changes when brought into contact with a grounded object;

wherein activation of the electromechanical switch into the ON state is inhibited until a grounded object is brought into contact with the capacitance sensitive touch sensor, such that an activation of the electromechanical switch to the ON state is enabled only upon contact with the capacitance sensitive touch sensor by the grounded object.

2. The vehicle control switch of claim 1 further comprising a processor in operative communication with the capacitance sensitive touch sensor, the processor programmed to:

receive an input signal from the capacitance sensitive touch sensor when the grounded object is brought in contact with the capacitance sensitive touch sensor;

compare a duration of the received input signal to a pre-determined threshold period of time; and if the duration of the received input signal is equal to or exceeds the pre-determined threshold period of time, then enable activation of the electromechanical switch into the ON state.

3. The vehicle control switch of claim 2 wherein physical actuation of the electromechanical switch only switches the electromechanical switch into the ON state when activation of the electromechanical switch is enabled by the processor, with physical actuation of the electromechanical switch when activation is inhibited resulting in the electromechanical switch remaining in the OFF state.

4. The vehicle control switch of claim 2 further comprising a lighted indicator located on or adjacent the electromechanical switch, the lighted indicator configured to indicate a current operational state of the vehicle control switch.

5. The vehicle control switch of claim 4 wherein the processor is further programmed to cause the lighted indicator to be selectively illuminated in a plurality of colors to indicate the current operational state of the vehicle control switch, the plurality of colors including:

a first color indicating that the electromechanical switch is in an OFF state;

a second color indicating that a grounded object has been in contact with the capacitance sensitive touch sensor for a duration equal to or exceeding the pre-determined threshold period of time, thereby also indicating that actuation of the electromechanical switch will activate the electromechanical switch into the ON state; and a third color indicating that the electromechanical switch is in the ON state.

6. The vehicle control switch of claim 1 wherein the electromechanical switch comprises a rocker switch constructed to accommodate a lifting actuation by the operator to be activated to the ON state.

7. The vehicle control switch of claim 6 further comprising a bezel positioned beneath the rocker switch, with the capacitance sensitive touch sensor being located at an underside of the bezel.

8. The vehicle control switch of claim 6 wherein the rocker switch is integrated into a vehicle dashboard of the motor vehicle, with the rocker switch having a design identical to other rocker switches in the vehicle dashboard.

9. The vehicle control switch of claim 1 wherein the vehicle control switch comprises a power takeoff (PTO) switch.

10. A vehicle control switch comprising:
an electromechanical switch switchable between ON and OFF states responsive to physical actuation of the electromechanical switch by an operator, the physical actuation comprising an application of force onto the electromechanical switch by the operator;
a capacitive touch switch positioned adjacent the electromechanical switch and whose capacitance changes when brought into contact with a finger of the operator; and
a switch controller operatively connected to the electromechanical switch and the capacitive touch switch, the switch controller programmed to:
sense when a finger of the operator is brought into contact with the capacitive touch switch;
measure a duration of time for which the finger of the operator is in contact with the capacitive touch switch;
compare the duration of time to a time threshold; and
if the duration of time exceeds the time threshold, then enable activation of the electromechanical switch into the ON state.

11. The vehicle control switch of claim 10 wherein a physical actuation of the electromechanical switch only switches the electromechanical switch to the ON state when activation of the electromechanical switch is enabled by the switch controller, with a physical actuation of the electromechanical switch when activation is not enabled resulting in the electromechanical switch remaining in the OFF state.

12. The vehicle control switch of claim 11 wherein the electromechanical switch comprises a rocker switch constructed to accommodate a lifting actuation by the operator to be activated to the ON state.

13. The vehicle control switch of claim 12 further comprising a bezel positioned beneath the rocker switch, with the capacitive touch switch being located at an underside of the bezel.

14. The vehicle control switch of claim 12 further comprising a light emitting diode (LED) indicator located within the rocker switch, the LED indicator programmed to indicate a current operational state of the vehicle control switch.

15. The vehicle control switch of claim 10 wherein the switch controller is programmed to cause the LED indicator to selectively illuminate in one of a plurality of colors based on a current operational state of the vehicle control switch.

16. The vehicle control switch of claim 15 wherein the switch controller is programmed to:
cause the LED indicator to illuminate in a first color when the electromechanical switch is in the OFF state and a finger of the operator has not been in contact with the capacitive touch switch for a duration of time exceeding the time threshold;
cause the LED indicator to illuminate in a second color when a measured duration of time with which the finger of the operator has been in contact with the capacitive touch switch for a duration exceeding the time threshold; and
cause the LED indicator to illuminate in a third color when the electromechanical switch is in the ON state.

17. A method of manufacturing a vehicle control switch comprising:
providing a rocker switch that is switchable by an operator between an ON state and an OFF state;
positioning a bezel adjacent a bottom of the rocker switch;
providing a capacitance sensitive touch sensor on an underside of the bezel whose capacitance changes when brought into contact with a finger of an operator;
operatively connecting a switch controller to the rocker switch and the capacitance sensitive touch sensor, the controller being programmed to:
sense when a finger of the operator is brought into contact with the capacitance sensitive touch sensor;
measure a duration of time which the finger of the operator is in contact with the capacitance sensitive touch sensor;
compare the duration of time to a time threshold; and
if the duration of time exceeds the time threshold, then enable actuation of the rocker switch into the ON state responsive to a physical actuation of the rocker switch by the operator.

18. The method of claim 17 further comprising:
integrating a light emitting diode (LED) indicator into the rocker switch, the LED indicator configured to indicate a current operational state of the vehicle control switch; and
operatively connecting the switch controller to the LED indicator, the switch controller being programmed to:
cause the LED indicator to illuminate in a first color when the rocker switch is in the OFF state and actuation of the rocker switch would not result in the rocker switch switching to the ON state;
cause the LED indicator to illuminate in a second color when a finger of the operator has been in contact with the capacitance sensitive touch sensor for a duration of time that exceeds the time threshold, thereby indicating that the activation of the rocker into the ON state is enabled; and
cause the LED indicator to illuminate in a third color when the rocker switch is in the ON state.

* * * * *